United States Patent [19]

Fujiyama

[11] Patent Number: 4,719,873
[45] Date of Patent: Jan. 19, 1988

[54] FILM FORMING APPARATUS

[75] Inventor: Yasutomo Fujiyama, Tokyo, Japan

[73] Assignee: Canon Kabushiki Kaisha, Tokyo, Japan

[21] Appl. No.: 770,154

[22] Filed: Aug. 27, 1985

[30] Foreign Application Priority Data

Sep. 7, 1984 [JP] Japan .................................. 59-186492

[51] Int. Cl.$^4$ ............................................. C23C 16/50
[52] U.S. Cl. .................................... 118/723; 118/729; 118/732
[58] Field of Search ............... 118/729, 730, 715, 723, 118/732

[56] References Cited

U.S. PATENT DOCUMENTS 4,593,644 6/1986 Hanak ................................. 118/729

Primary Examiner—Evan K. Lawrence
Attorney, Agent, or Firm—Fitzpatrick, Cella, Harper & Scinto

[57] ABSTRACT

A film forming apparatus utilizing discharge to accomplish film formation is provided with a cover electrode movable back and forth and a gas supply pipe. By moving the cover electrode, the cover electrode and a substrate containing cassette in which a substrate for film formation is contained and which is conveyed to a predetermined film forming position are electrically connected, and discharge is caused in the substrate containing cassette.

9 Claims, 9 Drawing Figures

FILM FORMING APPARATUS

BACKGROUND OF THE INVENTION

1. Field of the Invention

This invention relates to a film forming apparatus for forming deposited films on a substrate.

2. Description of the Prior Art

The following apparatus is known as a film forming apparatus, for example, a plasma CVD apparatus which can efficiently produce electrophotographic photosensitive drums.

That is, an apparatus in which a cathode electrode is constructed, use is made of a cover electrode having a pair of semicylindrical portions opposed to each other so as to form a cylindrical structure when joined together and movable back and forth relative to each other, a cylindrical substrate as an electrophotographic photosensitive drum is contained in said cover electrode in insulated relationship with the latter, reaction gas is injected into the cover electrode under a vacuum atmosphere and a high frequency power is supplied to between the cover electrode and the cylindrical substrate, whereby electrical discharge is caused between the two and films of amorphous silicon, for example, are deposited on the outer peripheral surface of the cylindrical substrate.

However, such a conventional film forming apparatus suffers from the following problems.

When the reaction gas is decomposed, films of polysilane, for example, accumulate also on the inner peripheral surface of the cover electrode. Accordingly, the films of polysilane thus deposited on the inner peripheral surface of the cover electrode must be removed each time one cycle of film formation is terminated. For that purpose, the inner side of the cover electrode must be subjected to dry etch cleaning. However, this dry etch cleaning takes a long time, e.g. about two hours and accordingly, the manufacturing efficiency of electrophotographic photosensitive drums becomes very low. Also, for this dry etch cleaning, use is made, for example, of a mixture of $CF_4$ and oxygen, and the film of polysilane decomposed in a high frequency plasma and adhering to the inner peripheral surface or the like of the cover electrode is gasified and removed. Accordingly, in the dry etch cleaning, strongly corrosive gases are produced and therefore, materials excellent in corrosion resistance must be used for the cover electrode, etc., and this leads to a very high cost of facilities. On the other hand, with such a point taken into account, there has also been proposed an apparatus in which a readily removable cylindrical insulator for causing polysilane and the like to adhere to the inner side and preventing polysilane and the like from adhering to the cover electrode, etc. is disposed between the cover electrode and the cylindrical substrate. In such an apparatus, however, an extra member such as the cylindrical insulator intervenes between the cover electrode and the cylindrical substrate. Therefore, it may become difficult to uniformly supply reaction gas to the entire circumference of the cylindrical substrate and as a result, it may become impossible to cause films of amorphous silicon to deposit uniformly on the outer peripheral surface of the cylindrical substrate. Also, discharge becomes unstable in the vicinity of the seam of the cover electrode and therefore, the thickness and quality of the accumulated films become non-uniform. Further, the cylindrical insulator is formed of alumina, quartz or the like. This has led to a problem in the durability of the cylindrical insulator, which in turn has led to a problem that caution must be exercised in handling the cylindrical insulator.

SUMMARY OF THE INVENTION

It is therefore an object of the present invention to eliminate the above-noted problems and to provide a film forming apparatus of very high production efficiency.

It is another object of the present invention to provide a film forming apparatus utilizing electrical discharge to accomplish film formation, characterized in that it is provided with a cover electrode movable back and forth and a gas supply pipe, and by moving said cover electrode, said cover electrode and a substrate containing cassette in which a substrate for film formation is contained and which is conveyed to a predetermined film forming position are electrically connected, and discharge is caused in said substrate containing cassette.

DESCRIPTION OF THE PREFERRED EMBODIMENTS

The present invention will hereinafter be described in detail by reference to the drawings.

Figure 1:
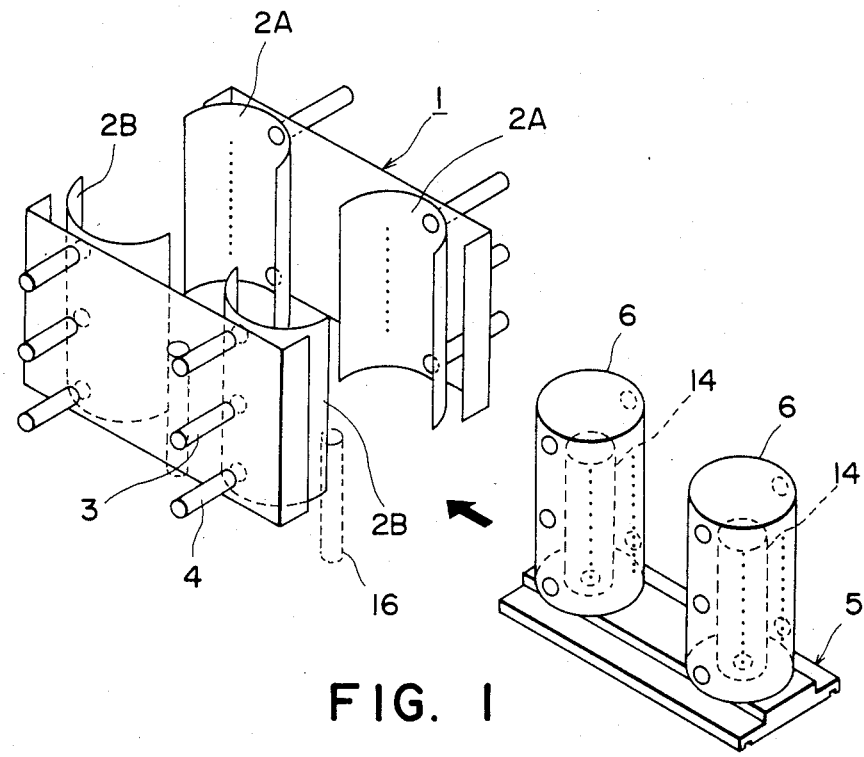
FIGS. 1, 2 and 3 are perspective views showing an embodiment of the film forming apparatus according to the present invention.
Figure 2:
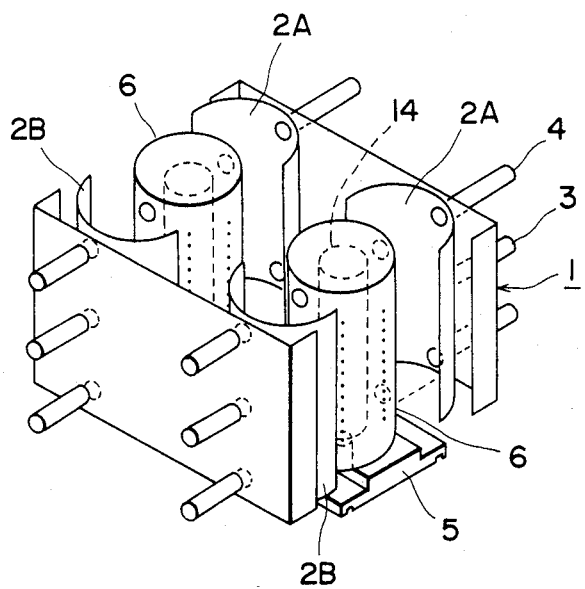
Figure 3:
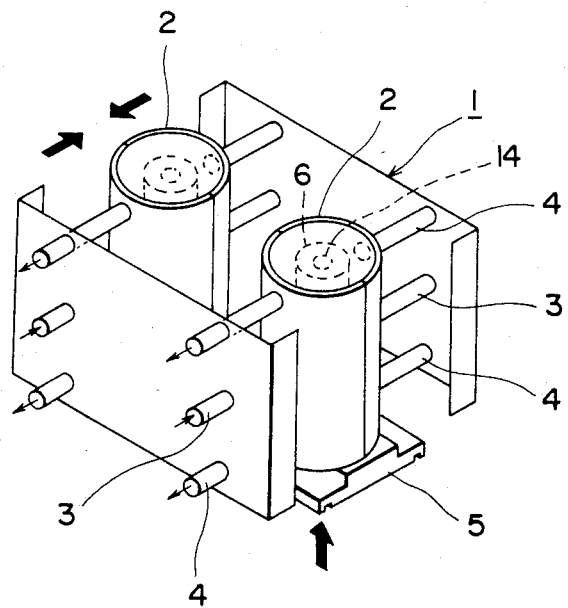

FIGS. 1, 2 and 3 are perspective views showing an embodiment of the film forming apparatus according to the present invention. In these Figures, reference numeral 1 designates a reaction chamber. A pre-heating chamber, not shown, is provided at one end of the reaction chamber, and a cooling chamber, not shown, is provided at the other end of the reaction chamber. Each chamber is of a hermetically sealed structure and although not shown, a gate valve is provided between the respective chambers, which can be individually rendered vacuum by an exhausting device.

In each of these Figures, only the side wall portions of the reaction chamber 1 are shown. Reference numeral 2 denotes cover electrodes each having a pair of semicylindrical portions 2A and 2B. This pair of semicylindrical portions 2A and 2B are opposed to each other so as to form a cylindrical structure when joined together, and moreover, one end of a reaction gas supply pipe 3 and one end of each of two gas exhaust pipes 4 are fixed thereto. The pipes 3 and 4 gas-tightly and slidably extend through the side walls of the reaction chamber 1 and are supported by driving means, not shown. Accordingly, the pair of semicylindrical portions 2A and 2B are brought toward or away from each other by the driving means, not shown, and form a cylindrical structure when joined together. The other end of the supply pipe 3 is connected to a reaction gas supply source, and the gas exhaust pipes 4 are connected to intake means. Such two cover electrodes 2 are arranged side by side in the direction of arrangement of the pre-heating chamber, the reaction chamber 1 and the cooling chamber, as shown.

Reference numeral 5 designates a coveying bed which is freely movable between the inner bottoms of the pre-heating chamber, the reaction chamber 1 and the cooling chamber along the direction of arrangement of these chambers. Two substrate-containing cassettes 6 of a hollow cylindrical structure are disposed side by side on the conveying bed 5. A cylindrical substrate 14 is contained within each of the cassettes 6.

As will later be described, the cylindrical substrates 14 contained within the cassettes 6 are first pre-heated in the pre-heating chamber which is in a vacuum atmosphere, and then are moved in the direction of arrow as shown in FIG. 1, and are conveyed by the conveying bed 5 to a predetermined position in the reaction chamber 1 in which the pair of semicylindrical portions 2A and 2B are separated from each other at the farthest distance. Then, as shown in FIG. 3, the pair of semicylindrical portions 2A and 2B are brought close to each other and joined together, whereafter the cassette 6 is snugly contained into each cover electrode 2 which now assumes the form of a cylindrical structure.

Figures 4, 5:
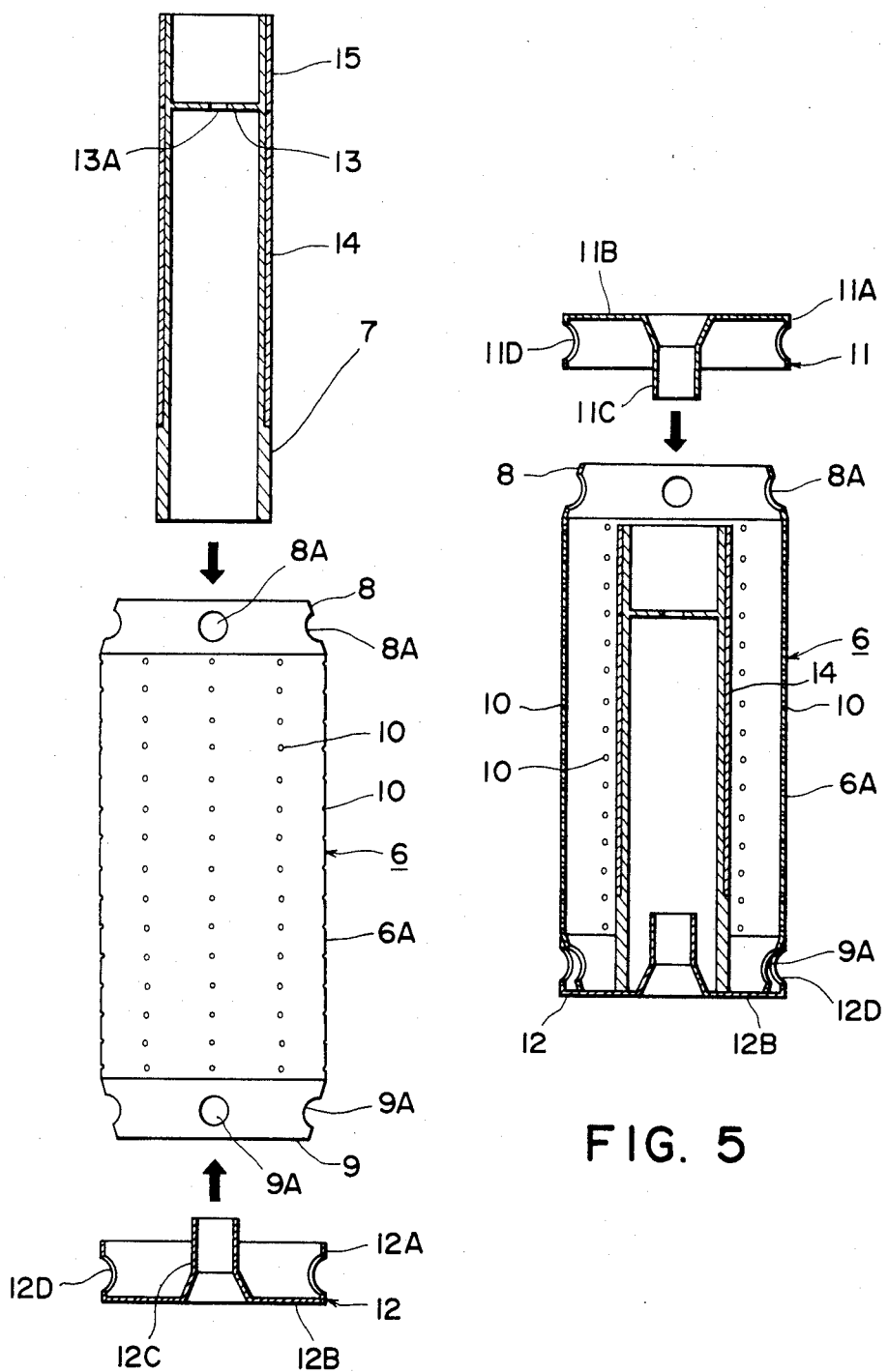
FIGS. 4, 5 and 6 show the details of a cassette and a cylindrical substrate.
Figure 6:
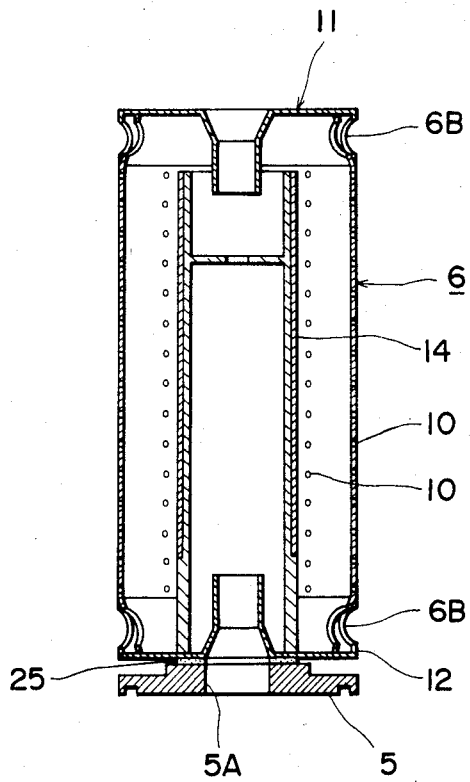

FIGS. 4, 5 and 6 show the details of a cassette 6 and a cylindrical substrate 14.

As shown in FIGS. 4 and 5, the cassette body 6A is of a hollow cylindrical structure and has lid coupling portions 8 and 9 at the upper and lower ends thereof. These coupling portions 8 and 9 are tapered and are formed with through-holes 8A and 9A provided equidistantly at four circumferential locations thereof. A plurality of rows of axially continuous gas injection ports are equidistantly formed circumferentially of the other portion of the cassette body 6A than the coupling portions 8 and 9. Reference numeral 11 designates an upper lid, and reference numeral 12 denotes a lower lid. The cassette 6 has the cassette body 6A, the upper lid 11 and the lower lid 12. The cassette 6 is formed of an electrically conductive material such as aluminum.

The cylindrical support bed 7 has a support plate 13 in the upper end portion thereof, and a cylindrical substrate 14 for forming an electrophotographic photosensitive medium is removably fixed to the outer side of the cylindrical support bed. The lower end of the cylindrical substrate 14 bears against the stepped portion of the lower end portion of the cylindrical support bed 7, and the upper end thereof bears against an annular keep member 15 fixed to the outer side of the upper end portion of the cylindrical support bed 7 and thus is fixed to the outer side of the cylindrical support bed 7. By removing the keep member 15 from the cylindrical support bed 7, the cylindrical substrate 14 can be removed from the cylindrical support bed 7.

The upper lid 11 and the lower lid 12 are of the same structure and may be put on the coupling portions 8 and 9, respectively, to close the upper end opening and the lower end opening, respectively, of the cassette body 6A. The upper lid 11 and the lower lid 12 has annular portions 11A and 12A in the form of straight tubes adapted to be opposed to the tapered annular portions of the coupling portions 8 and 9 when the lids are put on the coupling portions 8 and 9, and disk portions 11B and 12B adapted to close the both end openings of the cassette body 6A. Projections 11C and 12C each comprising a cylindrical structure are formed at the central portions of the disk portions 11B and 12B. The projections 11C and 12C each comprise a tapered portion continuous to the disk portion 11B, 12B and a straight tube portion continuous to the tapered portion. In the annular portions 11A and 12A, throughholes 11D and 12D are formed at two locations which intersect a straight line passing through the centers of the annular portions 11A and 12A. The upper lid 11 and the lower lid 12 can be coupled to the coupling portions 8 and 9 at the upper end and the lower end of the cassette body 6A by the well-known can making method. Thereby, a space 6B is formed between the annular portions of the coupling portions 8 and 9 and the annular portions 11A and 12A of the lids 11 and 12.

The cylindrical support bed 7 is contained in the cassette 6 in the following manner. First, as shown in FIG. 4, the lower lid 12 is coupled to the coupling portion 9 at the lower end of the cassette body 6A. Then, the cylindrical support bed 7 suspended by suitable suspension means is lowered from above the cassette body 6A through the upper end opening of the cassette body 6A into the cassette body 6A, and the lower end thereof is placed onto the disk portion 12B of the lower lid 12. In this case, the center axis of the cylindrical support bed 7 is brought into coincidence with the center axes of the cassette body 6A and the lower lid 12. An insulator may be interposed between the cylindrical support bed 7 and the lower lid 12, as required. This state is shown in FIG. 5. Subsequently, the upper lid 11 is coupled to the coupling portion 8 at the upper end of the cassette body 6A, as shown in FIG. 6. In this manner, the cylindrical bed 7 is contained in the cassette 6.

Through-holes are formed at two predetermined locations in the conveying bed 5, and the cassette 6 with the cylindrical support bed 7 contained therein is placed onto the conveying bed 5 so that the projection 12C at the lower end thereof is positioned on the through-hole in the conveying bed 5.

Figure 7:
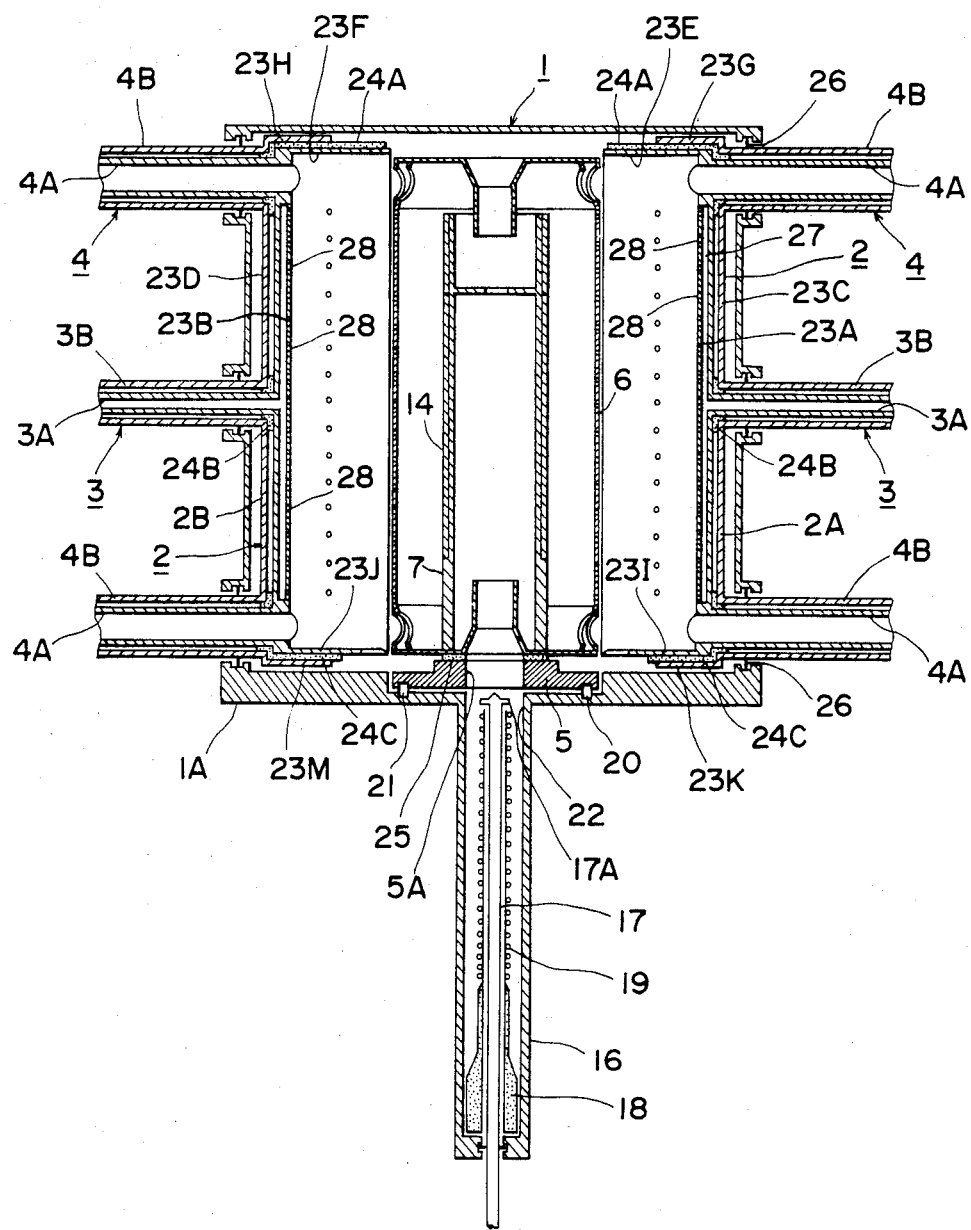
FIGS. 7 and 8 are cross-sectional views showing the details of a reaction chamber before and after, respectively, joining the two halves of a cover electrode.

FIG. 7 shows a cross-section of the reaction chamber 1 having a hermetically sealed structure. As shown in FIG. 7, through-holes 22 (only one of which is shown) are provided at two predetermined positions on the bottom wall 1A of the reaction chamber 1, i.e., at positions corresponding to the portion just beneath the axes of the pair of semicylindrical portions 2A and 2B when joined together, and a cylinder 16 having a hermetically sealed structure is disposed below the through-holes 22 so as to gas-tightly communicate with the through-holes 22, and a rod 17 as support means vertically movable in the reaction chamber 1 through the bottom wall 1A is vertically movably provided in the cylinder 16.

In the cylinder 16, the rod 17 has mounted thereon an insulating member 18 and a heater 19 continuous to the upper end of the insulating member 18. A disk-like head 17A is formed at an end of the rod 17. The rod 17 has its lower end connected to lift means, not shown, outside the cylinder 16, and is moved up and down by this lift means. The rod 17 is also rotated by rotative driving means, not shown.

The insulating member 18 is of such a cross-sectional shape that enables it to be closely fitted in the projection 12C at the lower end of the cassette 6.

As shown in FIG. 7, rollers 20 for moving the conveying bed 5 are mounted on the lower portion of the conveying bed. These rollers 20 are contained in grooves 21 formed in the bottom wall 1A of the reaction chamber 1, and the conveying bed 5 is moved along these grooves 21 to a predetermined position in the reaction chamber 1, and between the pair of semicylindrical portions 2A and 2B separated from each other, a through-hole 5A formed in the conveying bed 5 coincides with a through-hole 22 formed in the bottom wall 1A of the reaction chamber 1. In this state, by bringing the pair of semicylindrical portions 2A and 2B close to each other and joining them together, the cassette 6 is closely received into the cover electrode 2. This state is shown in FIG. 8.

Figure 8:
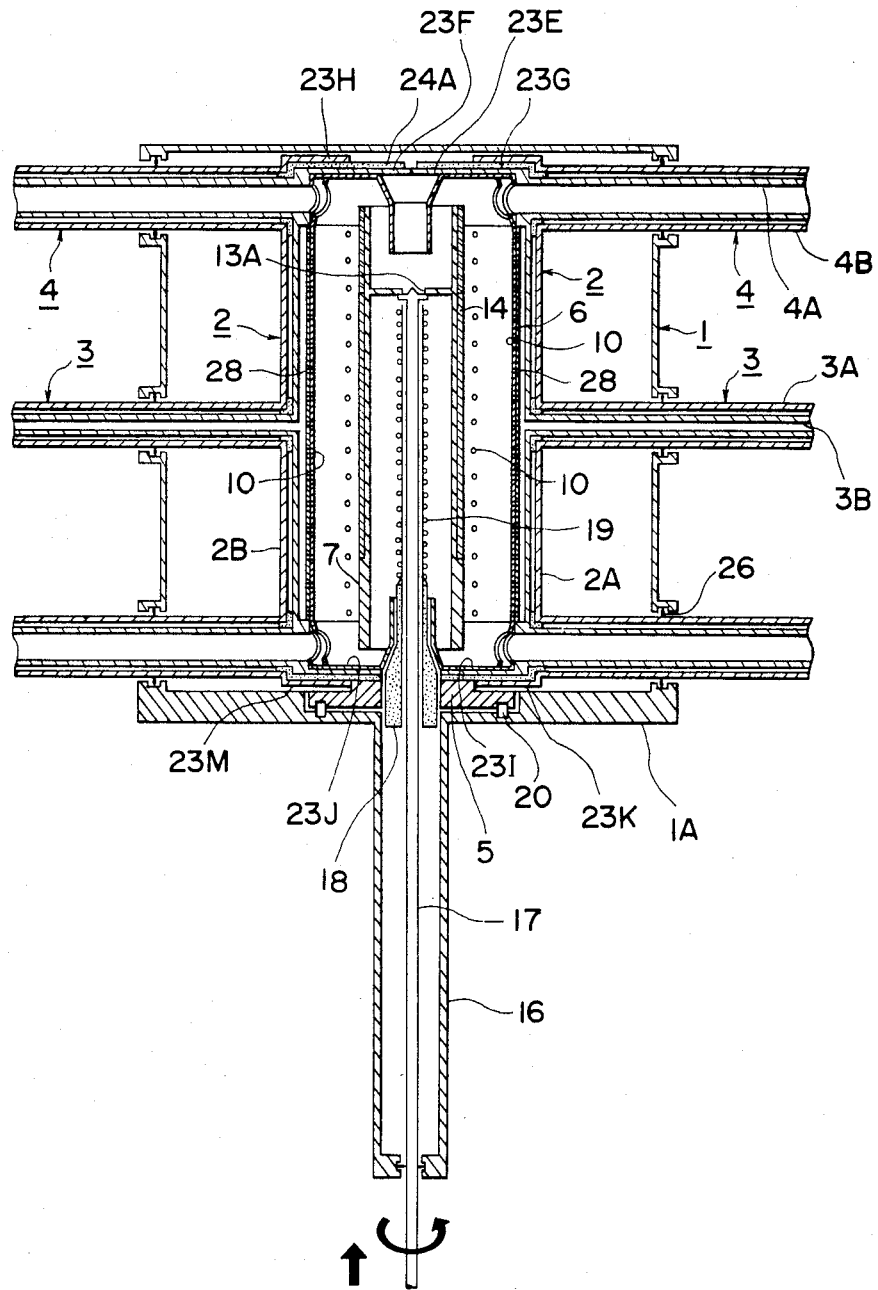

As shown in FIGS. 7 and 8, the pair of semicylindrical portions 2A and 2B are of a double-wall structure, while the reaction gas supply pipe 3 and gas exhaust pipes 4 are also of a double-pipe structure. FIGS. 7 and 8 show sequentially the semicylindrical portions before and after being joined. The inner peripheral walls 23A and 23B of the semicylindrical portions 2A and 2B and the inner pipes 3A and 4A of the supply pipe 3 and gas exhaust pipes 4 communicate with each other, and the outer peripheral walls 23C and 23D of the semicylindrical portions 2A and 2B and the outer pipes 3B and 4B, respectively, of the supply pipe 3 and gas exhaust pipes 4 communicate with each other.

Substantially semicircular top plates 23E, 23F, 23G and 23H and substantially semiannular bottom plates 23I, 23J, 23K and 23M are formed at the upper and lower ends, respectively, of the inner peripheral walls 23A and 23B and the outer peripheral walls 23C and 23D of the semicylindrical portions 2A and 2B. The inner peripheral walls 23A, 23B, the top plates 23E, 23F, the bottom plates 23I, 23J and the inner pipes 3A, 4A, and the outer peripheral walls 23C, 23D, the top plates 23G, 23H, the bottom plates 23K, 23M and the outer pipes 3B, 4B are insulated from one another by insulators 24A, 24B and 24C. The insulator 24A has a semicircular portion, and the insulator 24C has a semiannular portion. The outer periphery of the outer pipes of the supply pipe 3 and the gas exhaust pipes 4 and the peripheral wall of the reaction chamber 1 are hermetically sealed by a hermetic seal 26. An electrical insulator 25 provides electrical insulation between cassette 6 and conveying bed 5, thereby insulating the cassette from the chamber.

The portions of the inner peripheral walls 23A and 23B of the pair of semicylindrical portions 2A and 2B which are in communication with the two upper and lower inner pipes 4A are of a double-wall structure, and a space 27 is formed therebetween, and the inner pipe 3A of the supply pipe 3 is in communication with the outer portion thereof, and in the inner side portion thereof, a plurality of holes 28 are axially formed so as to coincide with the gas injection holes 10 formed in the cassette 6 when the pair of semicylindrical portions 2A and 2B are joined together, and these holes 28 are provided circumferentially in a plurality of rows. Accordingly, the reaction gas directed from the gas supply source into the space 27 through the inner pipe 3A of the supply pipe 3 passes through the holes 28 and the gas injection holes 10 and is uniformly injected into the cassette 6.

The inner pipes 4A of the gas exhaust pipes 4 gastightly communicate with the through-holes 11D and 12D in the upper lid 11 and the lower lid 12 of the cassette 6 when the pair of semicylindrical portions 2A and 2B are joined together. The other portion of the outer peripheral surface than the through-holes of the upper and lower lids 11 and 12 generally closely fits to the inner peripheral surfaces of the inner peripheral walls 23A and 23B of the pair of semicylindrical portions 2A and 2B. Accordingly, the gas in the cassette 6 passes through the through-holes 8A, 9A at the upper and lower ends of the cassette body 6A, the space 6B and the through-holes 11D, 12D in the upper and lower lids 11 and 12 into the gas exhaust pipes 4A without leaking, and is taken into intake means.

As shown in FIG. 8, the cassette 6 is connected to an RF power source through the inner peripheral surfaces of the inner peripheral walls 23A and 23B of the pair of semicylindrical portions 2A and 2B which are in intimate contact with the cassette 6, the inner pipe 3A of the supply pipe 3 and the inner pipes 4A of the gas exhaust pipes 4, and is supplied with a high frequency power from the RF power source.

By moving the rod 17 upwardly as shown in FIG. 8, the head 17A at the upper end thereof is caused to bear against the support plate 13 in the inner and upper portion of the cylindrical support bed 7 in the cassette 6, a portion of the head 17A is caused to project into a hole formed centrally of the support plate 13, and the rod 17 is further moved upwardly, whereby the cylindrical support bed 7 is raised from the lower lid 12 of the cassette 6 and thus, by the rod 17, the cylindrical substrate 14 held on the cylindrical support bed 7 is insulated and supported from the cassette 6 (cathode electrode). The cylindrical support bed 7 is grounded through the rod 17, etc.

The film forming apparatus of the present invention is constructed as described above and therefore, in the pre-heating chamber, the cassette 6 is pre-heated and, as shown in FIG. 8, the cassette 6 is set in the reaction chamber 1 in the manner described above, the cylindrical support bed 7 on which the cylindrical substrate 14 is held is rotated by the rod 17, reaction gas is supplied into the cassette 6 kept vacuum (the interior of the reaction chamber 1 is also kept vacuum), and a high frequency power is supplied to between the cylindrical support bed 7 and the cassette 6, whereby for example, films of amorphous silicon can be deposited on the outer peripheral surface of the cylindrical substrate 14. At this time, polysilane and like substances adhere also to the inner side of the cassette 6, but these adhere only to the inner side of the cassette 6 and do not adhere to the pair of semicylindrical portions 2A and 2B. Also, even if powder such as polysilane adhering to the inner side of the cassette 6 peels off therefrom, all the powder accumulates on the bottom of the cassette 6 and does not leak out of the cassette 6.

The cylindrical substrate 14 subjected to the reaction process is conveyed to the cooling chamber, in which it is cooled and then made into a product, and to carry the cylindrical substrate 14 from the reaction chamber 1 into the cooling chamber, the carrying is effected in the order opposite to what has been described above. That is, the rod 17 is lowered, the cylindrical support bed 7 on which the cylindrical substrate 14 is held is placed onto the bottom of the cassette 6, and then the pair of semicylindrical portions 2A and 2B are separated from each other, and the cassette 6 is placed onto the conveying bed 5 and subsequently, the gate valve between the reaction chamber 1 and the cooling chamber is opened, and then the conveying bed 5 is moved into the cooling chamber with the cassette 6. Removal of the cylindrical support bed 7 from within the cassette 6 can be accomplished by removing, for example, the upper lid 11 from the cassette body 6A, and then hanging up the cylindrical support bed 7 from within the cassette 6 by suitable suspension means.

The cover electrodes 2 are not limited to the above-described two-division structure, but may also be of a three-division or more-division structure. Also, at least one of the cover electrodes 2 may be moved.

Figure 9:
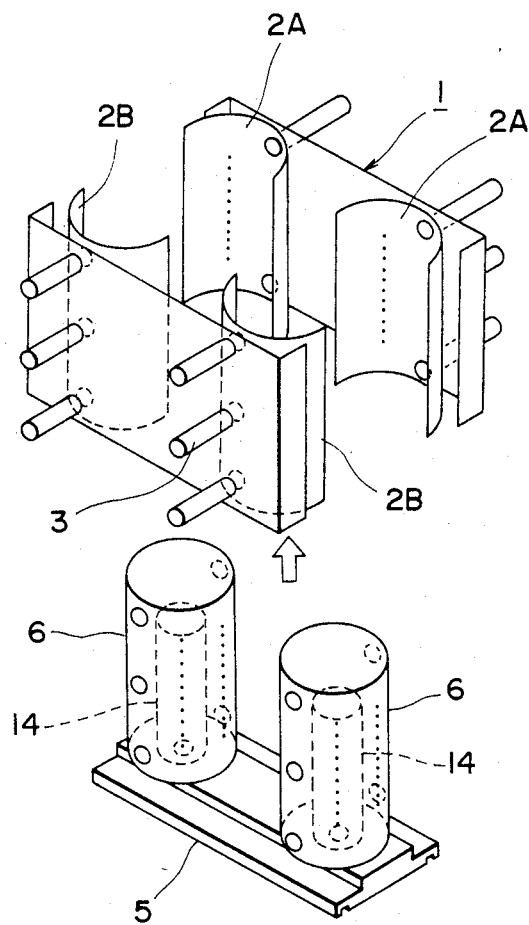
FIG. 9 is a perspective view showing another embodiment of the film forming apparatus according to the present invention.

Also, instead of moving the cassette 6 horizontally and placing it between the pair of semicylindrical portions 2A and 2B as described above, the cassette 6 may be moved vertically as shown, for example, in FIG. 9 and inserted between the pair of semicylindrical portions 2A and 2B from below (or from above).

According to the present invention, as described above, polysilane and the like deposited on the other portion than the cylindrical substrate during plasma reaction can be caused to deposit only on the inner side portion of the cassette handled integrally with the cylindrical substrate and therefore, polysilane and the like do not adhere to the fixed portions such as the cover electrodes 2 and the reaction chamber 1 and accordingly, no cleaning time is required and the apparatus can be operated very efficiently. Also, the cassette 6 is caused to act as a cathode electrode and the raw gas for film formation is directly supplied from the entire circumference thereof to the cylindrical substrate and therefore, films of amorphous silicon can be uniformly accumulated on the outer peripheral surface of the cylindrical substrate. Further, since the cathode electrode is of a seamless cassette structure, discharge does not become nonuniform at the seam of the electrode as has heretofore been experienced and thus, the thickness and quality of the deposited film do not become non-uniform.

Further, the cassette and the cylindrical substrate are integrally carried in and out and therefore, the production efficiency of the apparatus can be enhanced as compared with that of the abovedescribed conventional apparatus in which the cylindrical insulator is processed discretely from the cylindrical substrate.

According to the present invention, as described above, there can be provided a film forming apparatus of very high production efficiency.

I claim:

1. A film-forming apparatus utilizing electrical discharge to accomplish film formation comprising a reaction chamber, an electrically conductive cassette in said reaction chamber in which a substrate for film formation is contained, wherein said substrate is insulated and spaced from said cassette, a cover electrode provided in said reaction chamber movable from a first position separate from the cassette to a second predetermined film forming position in contact with and electrically connected to the cassette whereby electrical discharge is caused in said cassette, a gas supply pipe fixed to said cover electrode for injecting gas into said cassette and means connected to said apparatus for exhausting the reaction chamber to create a vacuum.

2. A film forming apparatus according to claim 1, wherein said cover electrode is divided in two.

3. A film forming apparatus according to claim 1, wherein said cover electrode is divided in three or more.

4. A film forming apparatus according to claim 1, wherein said cassette is a hollow cylindrical structure.

5. A film forming apparatus according to claim 1, wherein said cassette is formed of aluminum.

6. A film forming apparatus according to claim 1, wherein said cassette has a plurality of gas injection holes.

7. A film forming apparatus according to claim 2, wherein each of said cover electrodes is of a semicylindrical shape.

8. A film forming apparatus according to claim 1, wherein a pre-heating chamber for heating a substrate on which a film is formed to a desired temperature under vacuum before the film formation, is connected to said apparatus.

9. A film forming apparatus according to claim 1, wherein a cooling chamber for cooling a substrate on which a film is formed to a desired temperature under vacuum after the film formation, is connected to said apparatus.

* * * * *